(12) United States Patent
Kawada et al.

(10) Patent No.: US 6,448,861 B2
(45) Date of Patent: Sep. 10, 2002

(54) PLL CONTROLLER, METHOD OF PLL CONTROL, AND LIMITER

(75) Inventors: Noboru Kawada; Takashi Kaku; Takeshi Asahina; Tohru Ogawa; Hideo Miyazawa, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/788,841

(22) Filed: Feb. 20, 2001

Related U.S. Application Data

(63) Continuation of application No. PCT/JP99/01313, filed on Mar. 17, 1999.

(30) Foreign Application Priority Data

Aug. 21, 1998 (JP) ............................................ 10-235185

(51) Int. Cl.[7] .................................................. H03L 7/06
(52) U.S. Cl. ........................................ 331/17; 327/156
(58) Field of Search ............................ 331/17, 25, 1 A, 331/8, 15; 327/156–159

(56) References Cited

U.S. PATENT DOCUMENTS

| | | | |
|---|---|---|---|
| 4,031,483 A | * 6/1977 | Formeister | 331/17 |
| 4,929,917 A | * 5/1990 | Yokogawa et al. | 331/17 |
| 5,130,671 A | 7/1992 | Shahriary et al. | |
| 5,175,706 A | * 12/1992 | Edme | 365/226 |
| 5,329,252 A | 7/1994 | Major | |
| 5,539,357 A | 7/1996 | Rumreich | |
| 5,648,964 A | 7/1997 | Inagaki et al. | |

FOREIGN PATENT DOCUMENTS

| | | |
|---|---|---|
| EP | 0 492 588 A | 7/1992 |
| JP | 57-133709 | 8/1982 |
| JP | 4-309014 | 10/1992 |
| JP | 8-274633 | 10/1996 |
| JP | 9-294051 | 11/1997 |

* cited by examiner

*Primary Examiner*—David Mis
(74) *Attorney, Agent, or Firm*—Katten Muchin Zavis Rosenman

(57) ABSTRACT

A limiter is connected with the output of a PLL to limit the amplitude of the output from the PLL. The output from limiter is supplied to a voltage-controlled oscillator (VCXO). The limiter determines the difference between the input signal and the output signal. If the difference exceeds a predetermined value, the change in the output from the limiter is limited to the predetermined value. If the difference does not exceed the predetermined value, the change in the output is considered to be a difference value.

8 Claims, 11 Drawing Sheets

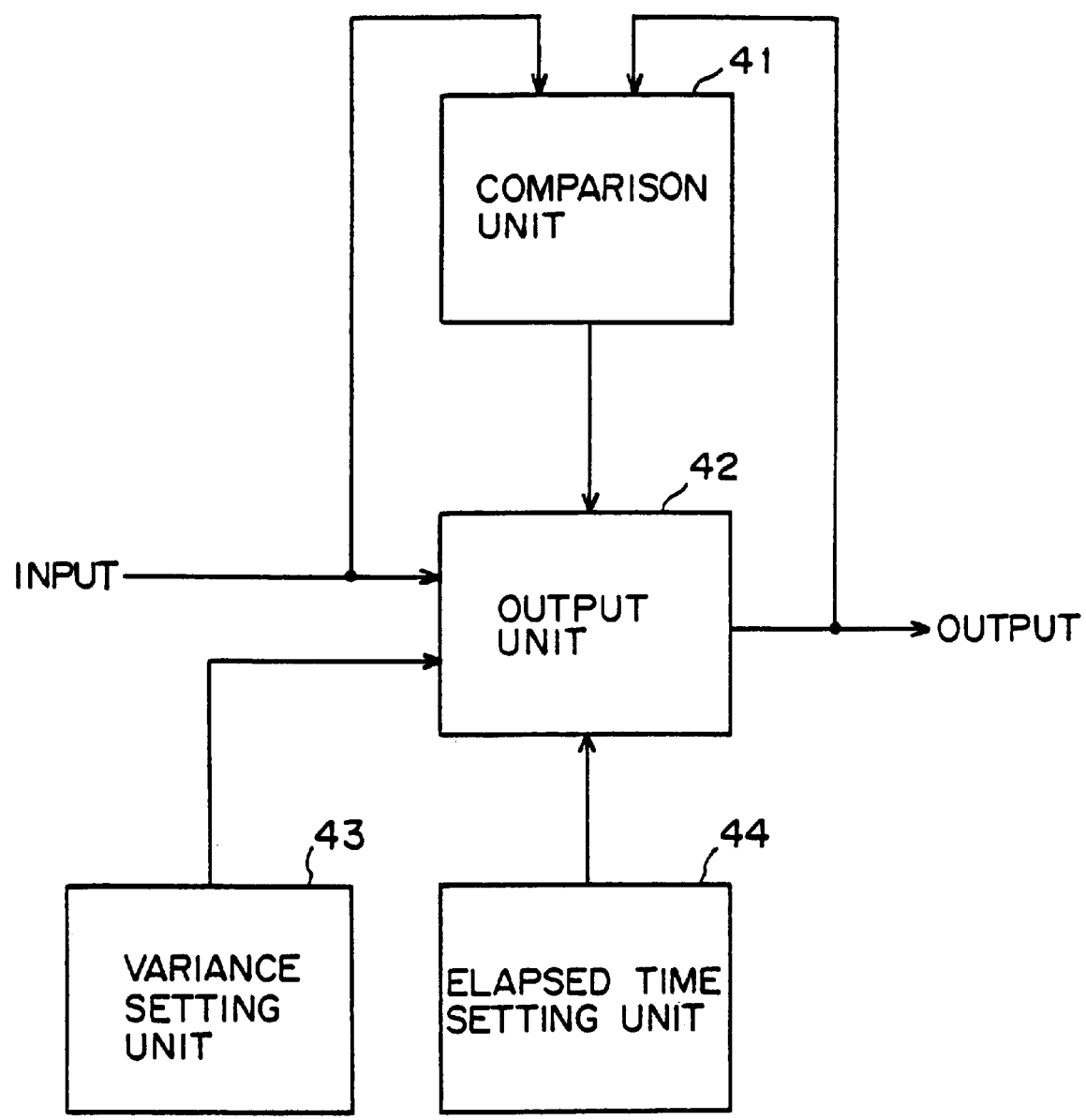
F I G. 5

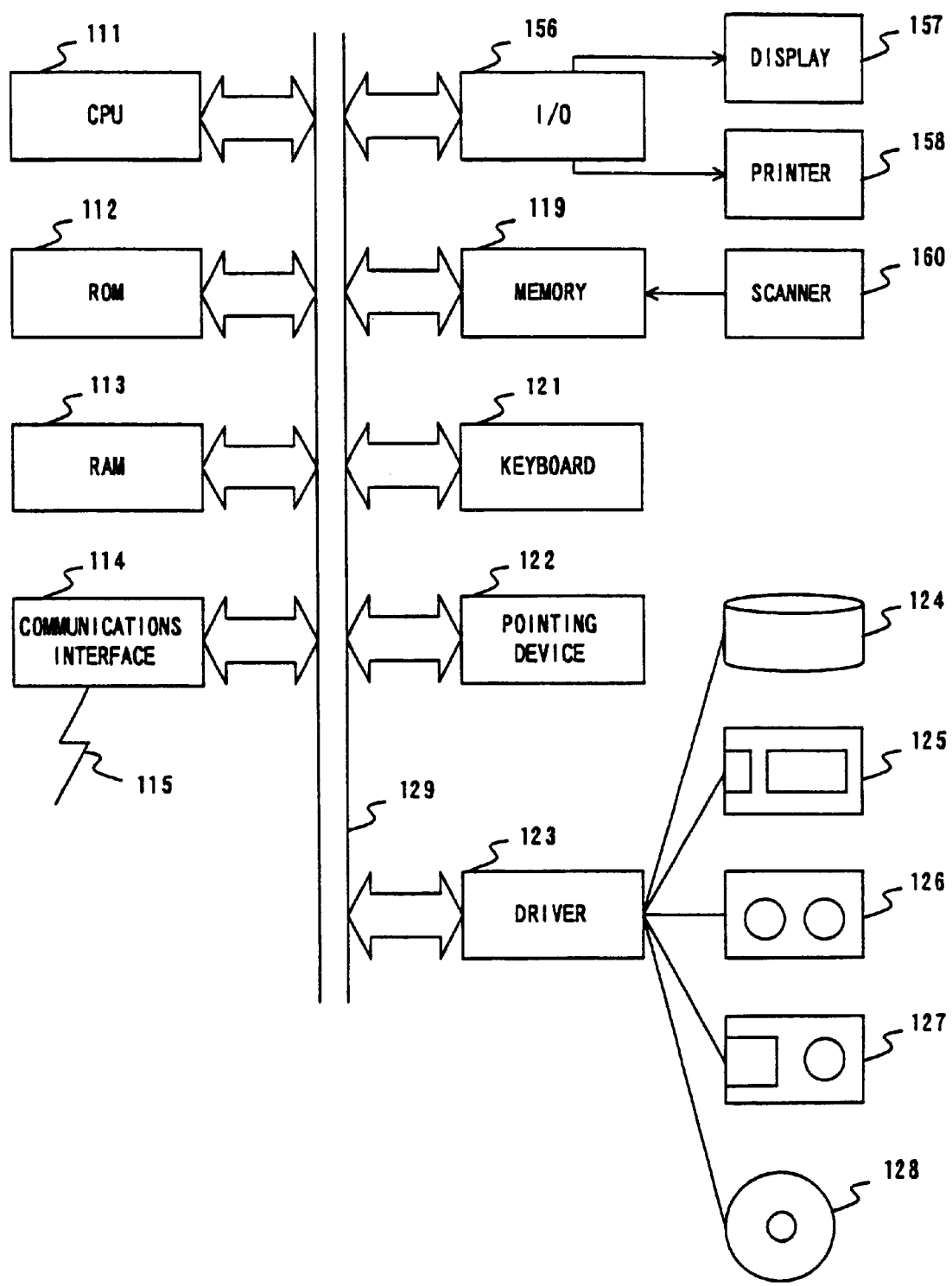
F I G. 1 1

PLL CONTROLLER, METHOD OF PLL CONTROL, AND LIMITER

CROSS REFERENCE TO RELATED APPLICATION

This application is a continuation of international PCT application No. PCT/JP99/01313 filed on Mar. 17, 1999.

BACKGROUND OF THE INVENTION

1. Technical Field

The present invention relates to a PLL (phase locked loop) control device and a control method in, for example, a transmission device, etc. such as a modem. In addition, the present invention relates to a limiter.

2. Description of the Related Art

Modems are widely used in transmitting data through a telephone line, a dedicated line, or a metallic line. Among these modems, a modem using a metallic line can be used in transmitting data at a high speed and realizing a data rate of several Mbps. As one of the functions of realizing such a data rate of several Mbps, a high precision PLL circuit is important and required.

FIG. 1 shows a parent station modem 2 and a child station modem 4 opposite to each other through a line 3. Each of the modems 2 and 4 is connected to terminals (DTE) 1 and 5 respectively. The parent station modem 2 receives a transmission timing signal ST 1 from the DTE1, and transmits data to the line 3 according to the ST 1. A child station modem 4 extracts a timing element from a received signal transmitted from the parent station modem 2, and establishes communications such that its operation can be synchronous with a timing signal. A PLL circuit has been conventionally used to synchronize the operation with a timing signal.

The PLL circuit controls the phase/frequency of a timing signal extracted from received information. In a conventional telephone line modem and a dedicated line modem, the PLL circuit is realized by a DSP (digital signal processor). However, since the PLL control can only be performed in a machine cycle unit of the DSP, the jitters become large in realizing the data rate of several Mbps, thereby complicating the configuration of a PLL circuit using a DSP.

One method of reducing the jitters with a PLL circuit is to use a voltage-controlled crystal oscillator.

FIG. 2 is a block diagram of the functions of the receiving unit of the child station modem 4, and especially shows the portion relating to the PLL control.

Since a signal received by the modem is an analog signal, the analog signal is converted into a digital signal by an A/D converter 11, and a demodulation unit 13 performs a demodulating process. Then, a timing extraction unit 14 extracts a timing element according to a demodulated signal.

A PLL unit 15 discriminates a discrepancy in phase/frequency between the timing signal extracted by the timing extraction unit 14 and the clock element of the modem itself, and outputs a control signal 20 for amendment of the discriminated discrepancy. The control signal 20 output from the PLL unit 15 is converted from a digital signal to an analog signal by a D/A converter 16. The demodulation unit 13, the timing extraction unit 14, and the PLL unit 15 are configured by a DSP 12.

A signal 21 converted into an analog signal by the D/A converter 16 is input to a VCXO 18 through an LPF (low pass filter) 17 for removing the noise element from a high frequency. The VCXO 18 controls the phase/frequency of an oscillation signal according to a signal 22 received from the LPF 17, and outputs an oscillation signal 23 after the control to a frequency division circuit 19.

The frequency division circuit 19 divides the frequency of the oscillation signal 23 output by the VCXO 18, and provides the signal for each modem unit. In addition, a signal frequency-divided by a frequency division circuit 19 is used as a sampling signal of the A/D converter 11.

Since the VCXO 18 can continuously (in an analog format) change the phase of the oscillation signal 23, it can reduce the jitter as compared with the case of configuring the PLL circuit. Therefore, it is desired that a PLL circuit applied to a modem realizing a high-speed data rate of several Mbps includes the circuit as shown in FIG. 2.

FIG. 3 shows the PLL unit of the parent station modem 2. It is necessary that the operation of the parent station modem 2 is synchronized with the ST1 received from the DTE1.

In the modem shown in FIG. 3, a phase comparison unit 31 compares the received timing signal ST 1 with the phase of its own clock. As a result, a PLL unit 32 outputs a control signal for control of a VCXO 35. Then, a D/A converter 33 converts a control signal into an analog signal, and the control signal is provided for the VCXO 35 through an LPF 34.

The VCXO 35 controls an output frequency according to the received control signal. The output of the VCXO 35 is frequency-divided by a frequency division circuit 36, and is supplied as a clock signal to each circuit. The output of the frequency division circuit 36 is compared in phase with the timing signal ST 1 by the phase comparison unit 31.

However, when such a PLL circuit is used, the following problem can occur.

When the value of the control signal input to the VCXOs 18 and 35 to control the frequency of an output signal is suddenly changed, the outputs of the VCXOs 18 and 35 become unstable. In an extreme case, the outputs of the VCXOs 18 and 35 can stop for a moment.

In the child station modem 4, the output of the VCXO 18 becomes unstable in the following case. Namely, when power is disconnected or a line abnormal condition occurs in the parent station modem 2, the child station modem 4 cannot receive a signal. As a result, the child station modem 4 cannot extract the timing signal ST1, so that the value of the control signal 20 of the VCXO 18 suddenly changes.

In the meantime, in the parent station modem 2, the output of the VCXO 35 becomes unstable in the following case. That is, the value of the control signal of the VCXO 35 suddenly changes when the power if the DTE 1 is disconnected, or the timing signal ST1 starts to be received.

In any case, the modems 2 and 4 cannot extract a timing signal, that is, the modems are in an abnormal condition. Therefore, they function to suddenly change the control signals of the VCXOs 18 and 35.

FIG. 4A shows the state of the control signal 20 of the VCXO 18 output from the PLL unit 15. The signal 21 of the D/A converter 16 has actually the same waveform. It is assumed that the control signal 20 of a VCXO 18 changes in the range from 0 to 5 V. When a power disconnection/abnormal line occurs at the point of A, the child station modem 4 (PLL unit 15) suddenly changes the control signal 20 of the VCXO 18 as shown in the attached drawings.

FIG. 4B shows the output waveform of the LPF 17. The control signal 20 output from a PLL unit 15 gradually changes depending on a time constant of the LPF 17, and is input to the VCXO 18. When the LPF 17 cannot absorb the variance acceptable by the VCXO 18, the oscillation signal 23 of the VCXO 18 stops for a moment as shown in FIG. 4C. When the oscillation signal 23 of the VCXO 18 stops, the operation of the circuit in and after the frequency division circuit 19 becomes abnormal, thereby resulting in the problem that communications cannot be established, etc.

A method of solving the problem is to set a large time constant of the LPF 17. The waveform indicated by the dotted line shown in FIG. 4B shows the signal 22 of the LPF 17 when the time constant of the LPF 17 is set to a value larger than the time constant of the waveform indicated by the solid line. In the case, the signal 22 of the LPF 17 can be more gradual than in the case of the waveform indicated by the solid line shown in FIG. 4B. Thus, the fluctuation of the control signal 20 can be maintained within the variance acceptable by the VCXO 18.

However, the LPF 17 is configured by a simple CR circuit. Since these circuit elements, especially capacitors C are uneven in properties of each unit, it is necessary in consideration of the unevenness in each unit to set the time constant of the LPF 17 to a value properly larger than a value required to keep the variance of the control signal 20 of the VCXO 18 in the allowable range because there is the possibility that the time constant of the LPF 17 becomes a value smaller than a desired value.

However, in this case, when a set value for a time constant of the LPF 17 is larger than the minimal value, there actually arises a delay of the control signal 20 of the VCXO 18. Especially, the time constant of the LPF 17 becomes unnecessarily large depending on the state of each unit, thereby furthermore prolonging the delay time.

When there arises the delay of the control signal 20 of the VCXO 18, the control of the VCXO 18 is delayed by the delay time of the control signal 20, and the quick PLL control cannot be realized. As a result, there can be the possibility of the problem with the PLL control. Therefore, the method of setting a large time constant of the LPF 17 may be effective as a measure not to stop the output 23 of the VCXO 18 for a moment, but cannot be effective for the entire PLL control of the modem 4.

A similar problem can occur with the parent station modem 2.

Thus, the present invention aims at providing a PLL control device and a limiter capable of stably performing PLL control without stopping the output of the VCXOs 18 and 35 for a moment.

SUMMARY OF THE INVENTION

To solve the above described problem, the present invention has the configuration containing a limiter for limiting the amplitude of a control signal for control of a voltage-controlled oscillator. The limiter compares the amplitude value of a signal output from the limiter with the amplitude value of an input control signal, and determines whether or not the difference between the amplitude value of the input control signal and the amplitude value of the output signal is equal to or larger than a predetermined limit value.

When it is determined that the difference between the amplitude of the input control signal and the amplitude of the output signal is equal to or larger than the limit value, the amplitude of the output signal is limited to the amplitude obtained by increasing or decreasing the amplitude obtained in the comparing process by the limit value.

On the other hand, if it is determined that the difference between the amplitude of the input control signal and the amplitude of the output signal is not larger than the limit value, the amplitude of the output signal is obtained by increasing or decreasing the amplitude obtained in the comparing process by the difference in amplitude between the output signal and the input control signal.

By providing the control signal for the voltage-controlled oscillator through the above described limiter, the variance of the control signal input to the voltage-controlled oscillator can be reduced without a capacitor, the problem (momentary output stop, etc.) with the voltage-controlled oscillator can be prevented from occurring by a sudden change of the amplitude of a control signal, and the delay of control of the voltage-controlled oscillator can be prevented from being suppressed.

Especially, the comparison in amplitude between the output signal and the input signal can also be performed at predetermined time intervals, thereby setting the time constant of the control signal of the voltage-controlled oscillator to a required value by appropriately selecting the limit value and the comparison intervals.

Specifically, the function of the limiter can be realized in a digital process. It is convenient when the PLL control is performed by a DSP, etc. in a digital process. A limiter process can also be performed only by rewriting firmware without replacing hardware. If the DSP, etc. can also be used in another process, the present invention can be applied to the conventional devices such as a modem, etc.

By digitally realizing a limiter function, the conventional problems with an analog circuit of the conventional LPF, etc. such as the variance of a time constant due to uneven units, the delay of a control signal, etc. can be suppressed.

BRIEF DESCRIPTION OF THE DRAWINGS

FIG. 5 is a block diagram of the configuration of the PLL controller according to an embodiment of the present invention;

FIG. 11 is a block diagram of the configuration of the PLL controller according to an embodiment of the present invention when it is realized by software.

DESCRIPTION OF THE PREFERRED EMBODIMENTS

The PLL controller according to an embodiment of the present invention is described below by referring to the attached drawings.

FIG. 5 is a block diagram of the configuration of the PLL controller according to an embodiment of the present invention. In FIG. 5, a comparison unit 41 compares the amplitude of the current input signal with the amplitude of the current output signal, and transmits the difference to an output unit 42. When the difference received from the comparison unit 41 is larger than a limit value set in a variance setting unit 43, the output unit 42 outputs the signal obtained by increasing or decreasing the current output signal by the limit value to the voltage-controlled oscillator until the time set by the elapsed time setting unit 44 elapses.

On the other hand, when the difference received from the comparison unit 41 is equal to or smaller than a limit value set in a variance setting unit 43, the output unit 42 outputs the current input signal as is to the voltage-controlled oscillator until the time set by the elapsed time setting unit 44 elapses. If the time set by the elapsed time setting unit 44 has elapsed, the above described operations are repeated again.

The limit value set by the variance setting unit 43 and the elapsed time set by the elapsed time setting unit 44 can be freely set such that the delay of the control of the voltage-controlled oscillator can be reduced, and the voltage-controlled oscillator can be prevented from malfunctioning.

Thus, even when the amplitude of a control signal input to the voltage-controlled oscillator suddenly changes, the control signal can be gradually changed and input to the voltage-controlled oscillator. Therefore, the voltage-controlled oscillator can be prevented from malfunctioning, and the delay of the control of the voltage-controlled oscillator can be suppressed. When the configuration shown in FIG. 5 is realized by a DSP, it is not necessary to consider the variance of the features of each unit.

Figure 6:
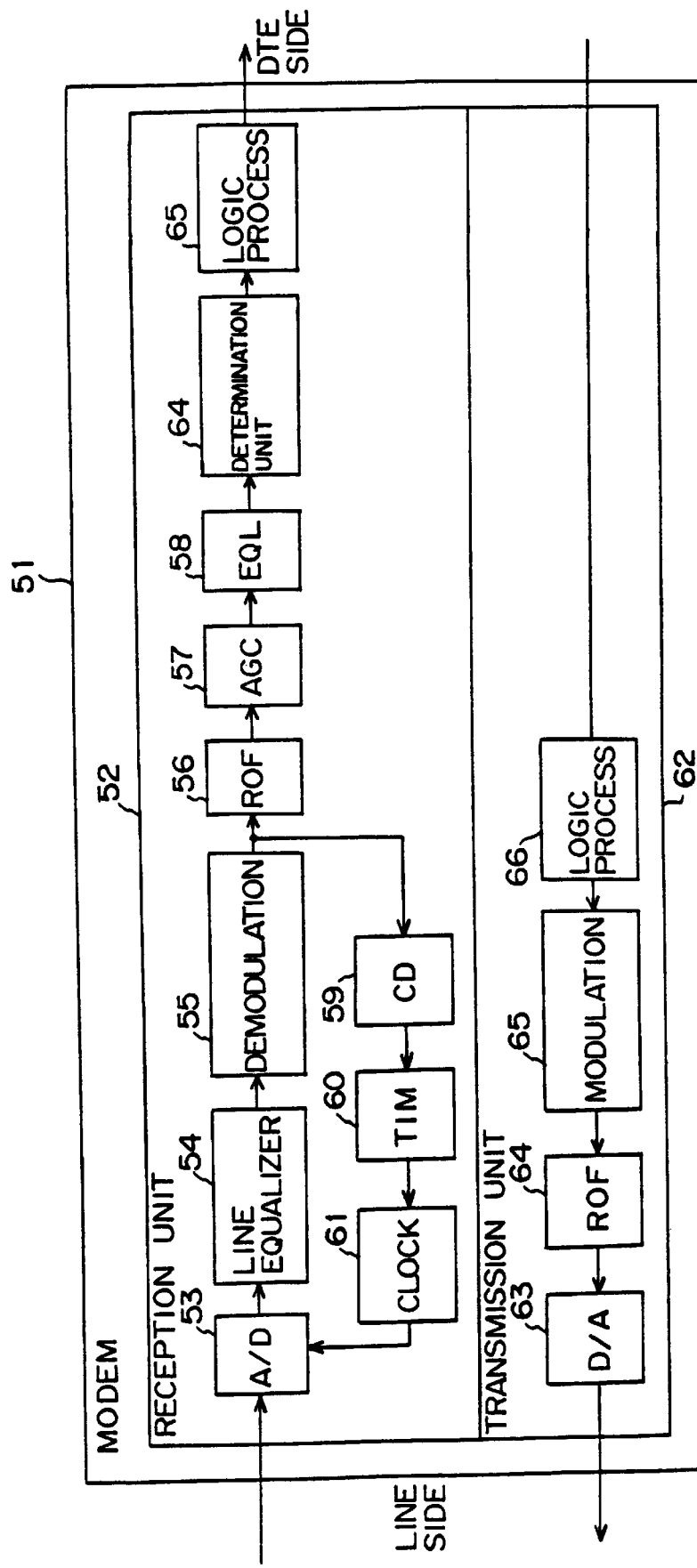
FIG. 6 is a block diagram showing an example of the configuration of the modem to which an embodiment of the present invention is applied.

FIG. 6 shows the internal configuration of a modem 51 as an example of the device to which an embodiment of the present invention is applied. The modem 51 is divided into a reception unit 52 and a transmission unit 62. The left portion of FIG. 6 corresponds to the line side, and the right portion of FIG. 6 corresponds to the DTE side.

The analog signal received through the line is converted into a digital signal by an A/D converter 53. Then, the signal line-equalized by a line equalizer 54 is demodulated by a demodulation unit 55. The signal output from the demodulation unit 55 is output to the DTE side through a roll-off filter (ROF) 56, an automatic gain control unit (AGC) 57, an equalizer (EQL) 58, a determination unit 64, and a logic process unit 65.

In addition, a signal output from the demodulation unit 55 is also transmitted to a compact disk (CD) 59 for checking the existence of a carrier. Then, a signal output from the CD 59 is input to a timing extraction unit (TIM) 60, and a timing element is extracted. According to the timing signal extracted by the TIM 60, a clock generation unit 61 generates a clock signal. The clock signal generated by the clock generation unit 61 is provided for each unit. In the example shown in FIG. 6, the clock signal is provided for the A/D converter 53 for use as a sampling clock.

On the other hand, in the transmission unit 62, a logic process unit 66 performs a logic process on a signal received from the DTE side, and the logic process unit 65 modulates the processed signal. Then, the signal is passed through the roll-off filter 64, and is converted from a digital signal to an analog signal by a D/A converter 63 for transmission to a circuit.

Figure 1:
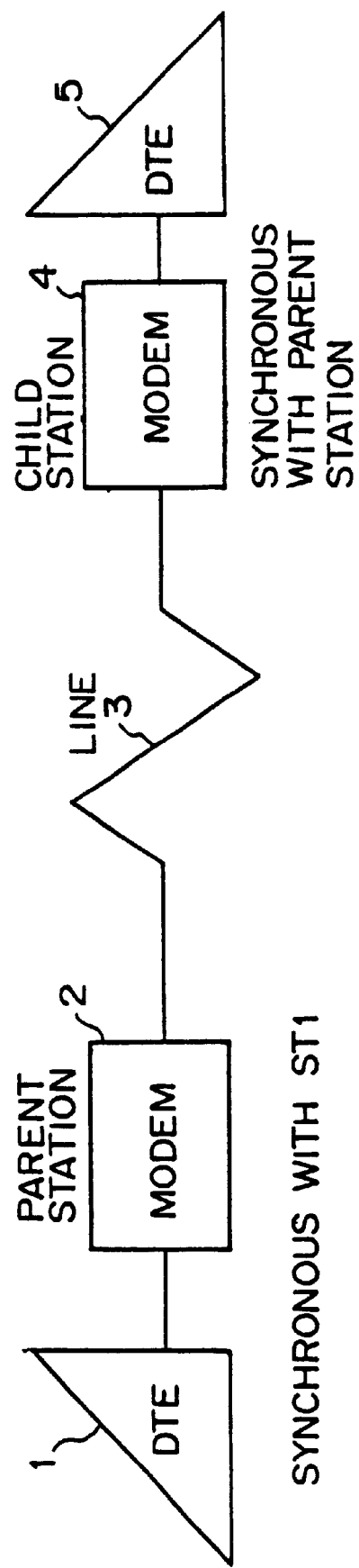
FIG. 1 is a block diagram showing an example of connecting a modem to a line.
Figure 2:
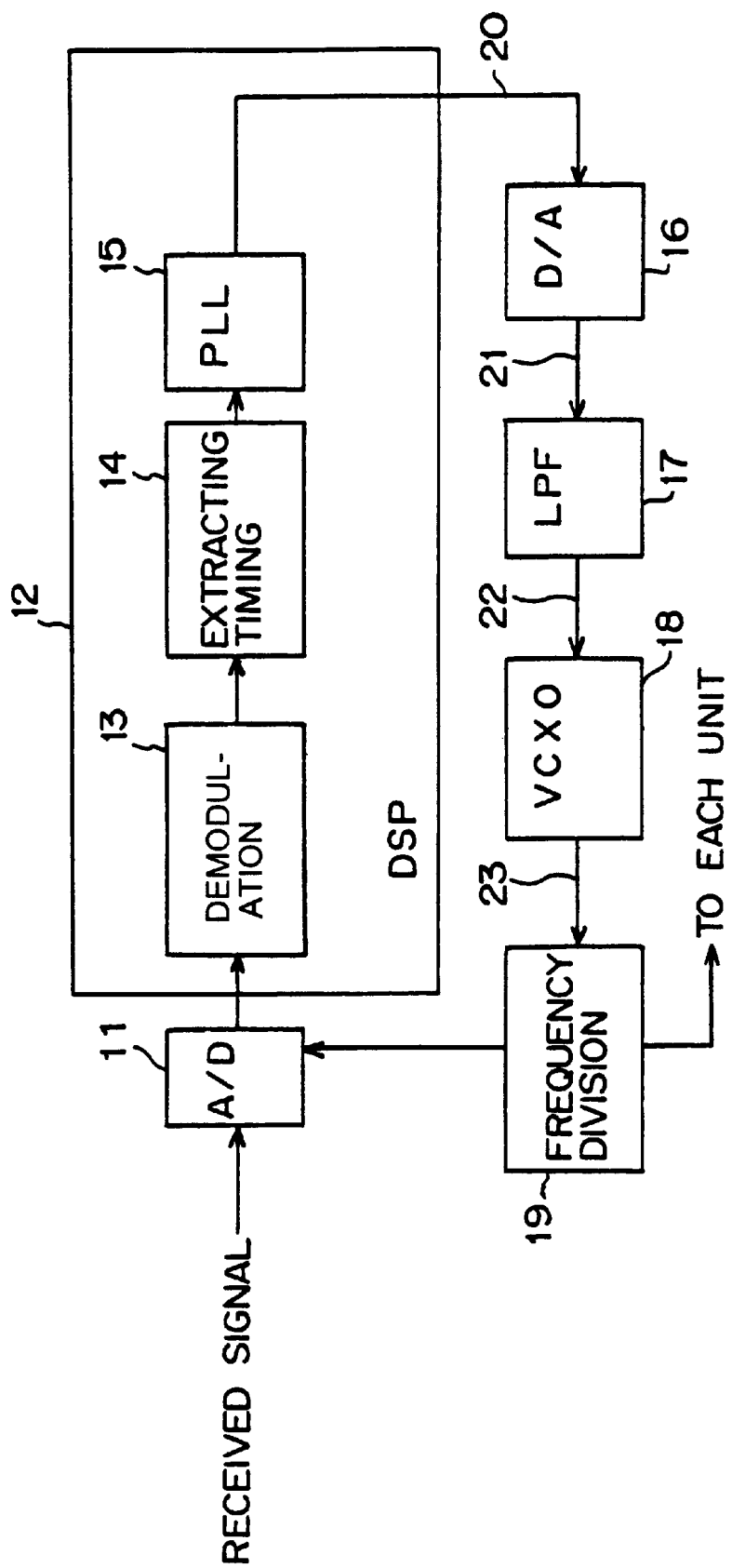
FIG. 2 is a block diagram of the configuration of the reception unit of a child station modem.
Figure 3:
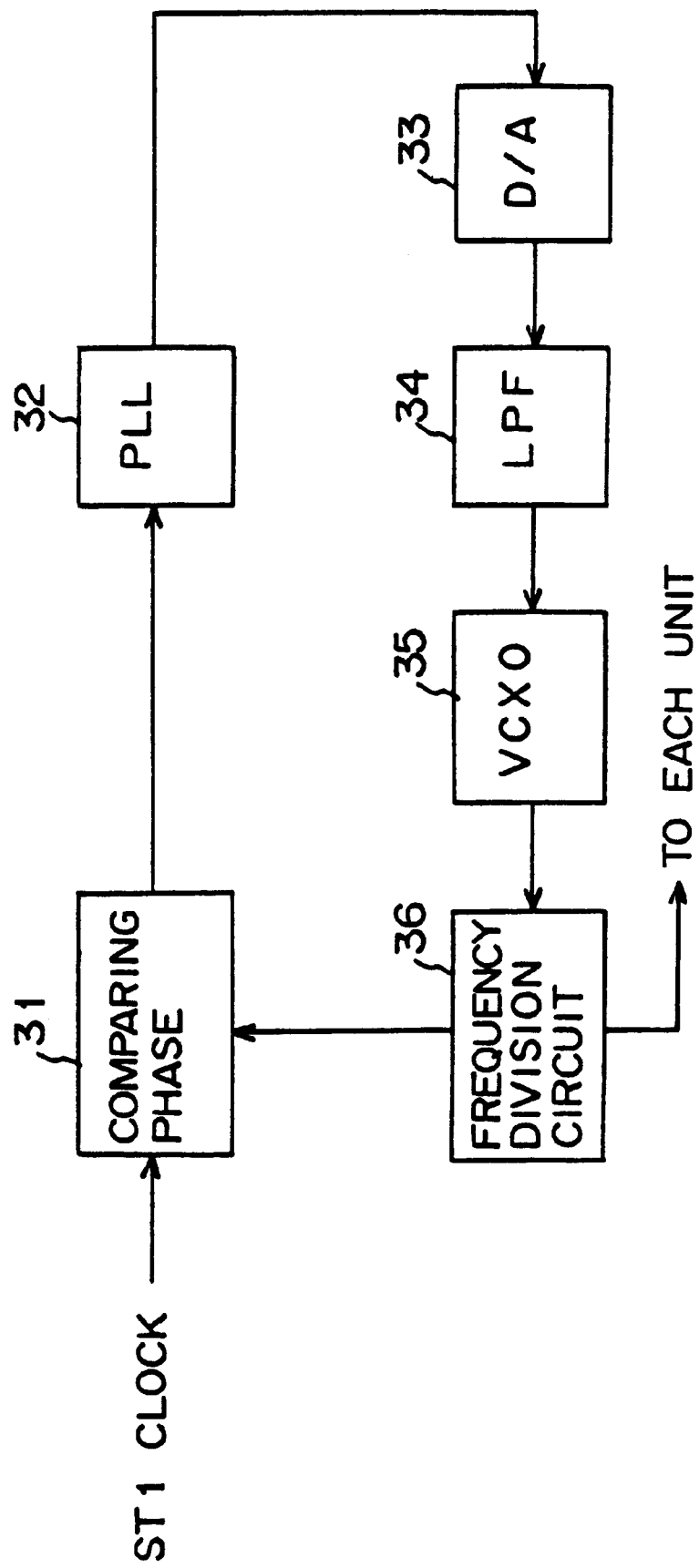
FIG. 3 is a block diagram of the configuration of the PLL unit of a parent station modem.
Figure 7:
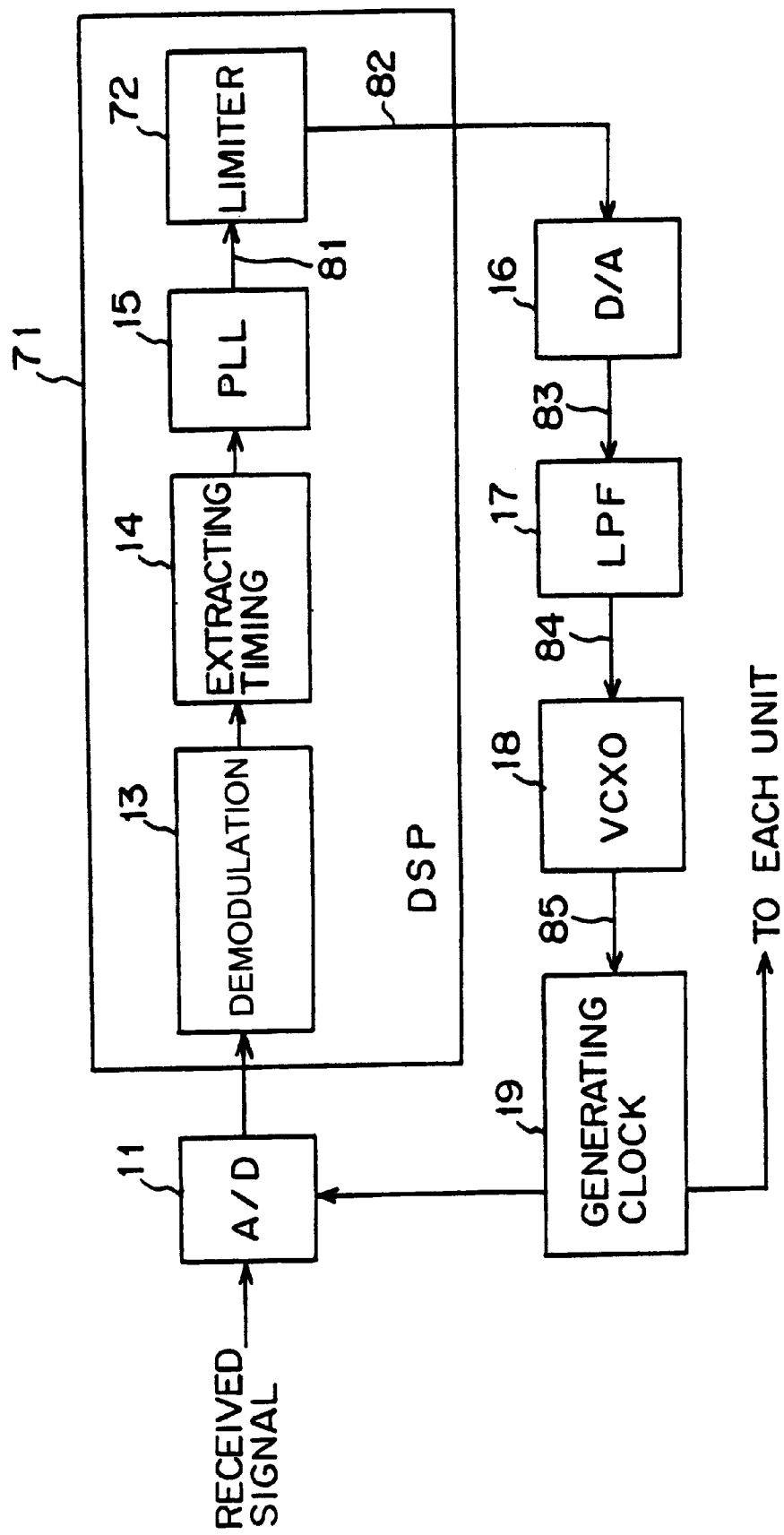
FIG. 7 is a block diagram of the configuration of the reception unit of the child station modem according to an embodiment of the present invention.

FIG. 7 is a block diagram of the function of the reception unit of the child station modem according to an embodiment of the present invention. As in FIG. 2, the portion relating to the PLL control is extracted in FIG. 7. The unit assigned the same identification number as the unit shown in FIG. 2 has the function similar to the function of the corresponding unit shown in FIG. 2. Therefore, the detailed explanation is omitted here. The embodiments shown in FIG. 7 are described below in detail by referring to the attached drawings.

The embodiment shown in FIG. 7 comprises a limiter 72 at a stage after the PLL unit 15. The limiter 72 digitally limits a control signal output from the PLL unit 15 and input to the D/A converter 16. When the value (variance) of the control signal exceeds a predetermined value, the output of the limiter 72 is a constant value. Described below in detail is the operation of the limiter 72.

Figure 4:
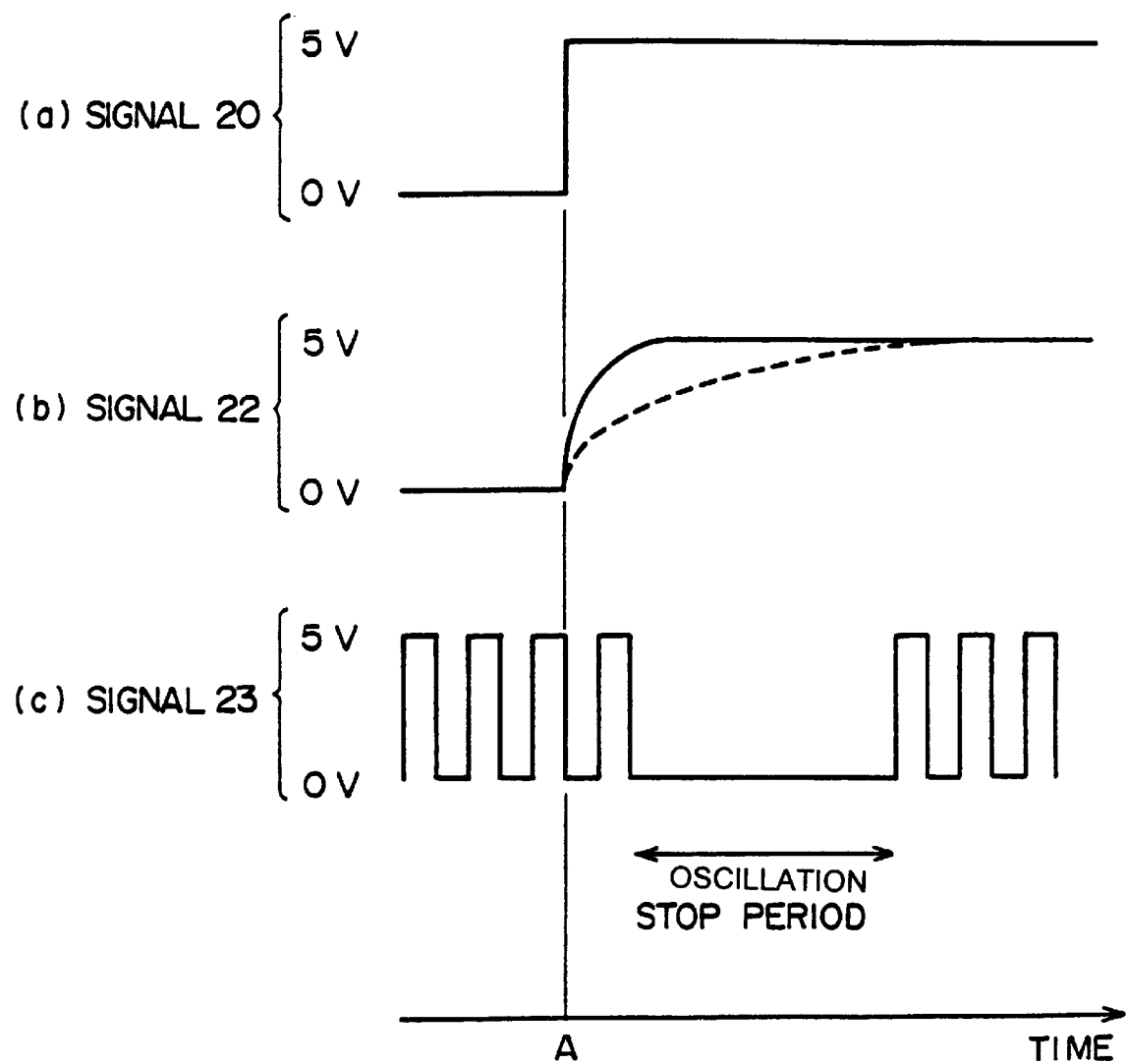
FIG. 4 shows a waveform of an output signal of each unit of the modem shown in FIG. 2.
Figure 8:
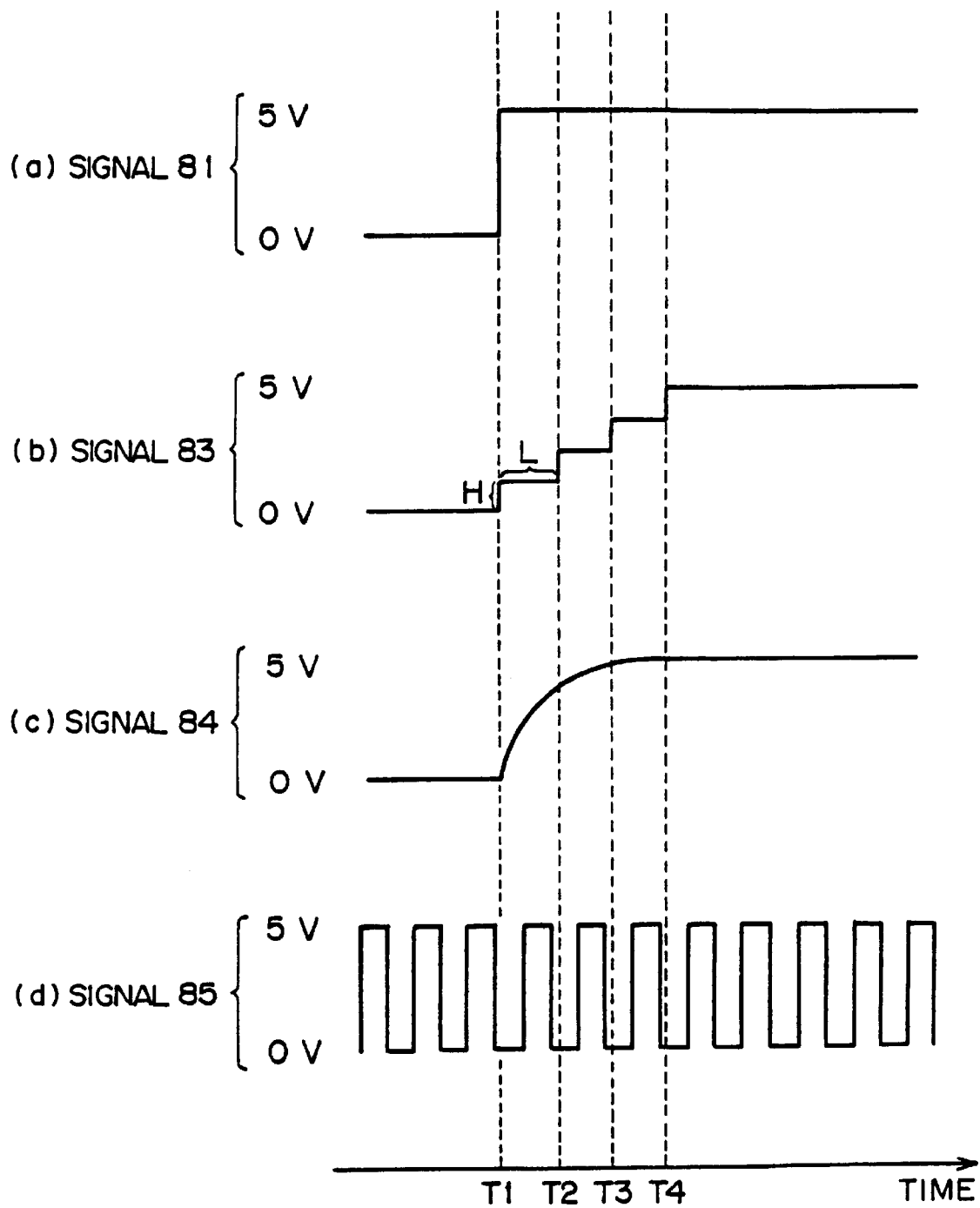
FIG. 8 shows a waveform of an output signal of each unit of the child station modem shown in FIG. 7.

As in FIG. 4A, FIG. 8A shows the change of a control signal output from the PLL unit 15. It is assumed that the power of a corresponding modem has been disconnected at the point of T1. In this case, a signal cannot be received from the corresponding modem, or a timing element cannot be extracted. Therefore, the PLL unit 15 attempts to suddenly change a control signal 81 from 0 V to 5 V at the point of T1.

FIG. 8B shows a D/A conversion result 82 of a signal output from the limiter 72 in response to the input signal 81 shown in FIG. 8A. The limiter 72 determines the difference between the amplitude of the input signal 81 and the amplitude of the output signal 82 at predetermined time intervals L. When the variance between the amplitude of the output signal 82 and the amplitude of the input signal 81 (to be more practical, the difference between the output signal 82 and the input signal 81) is larger than a predetermined value H, the function of limiting the amplitude of the output signal to the predetermined value H is assigned. That is, in this case, the predetermined value H is added to, or subtracted from the amplitude of the output signal 82 when the amplitude is determined.

The descriptions are given further in detail below by referring to FIG. 8B. At the stage at T1 or before, the value of the control signal 81 is 0 V. Therefore, the signal 82 output from the limiter 72 is also 0 V. At the point of T1, the control signal 81 suddenly changes from 0 V to 5 V. In the limiter 72, the amplitude (0 V) of the signal 82 output at the point of T1 is compared with the amplitude (5 V) of the input signal 81. When the amplitude (difference between the two amplitudes) of the input signal 81 as compared with the output signal 82 is larger than the predetermined value H, the limiter 72 limits the amplitude of the output signal to the predetermined value H. The H is defined as a limit value.

For example, when the predetermined H is 1.5 V, the limiter 72 determines whether or not the difference between the amplitude (5 V) of the input signal 81 and the amplitude (0 V) of the output signal 82 is larger than 1.5 V. If the difference is larger than 1.5 V, then the variance of the output signal 82 is limited to 1.5 V. Thus, even when the control signal 81 suddenly changes from 0 V to 5 V, the voltage of the variance can be prevented from being quickly applied to the VCXO 18, thereby preventing the oscillation of the VCXO 18 from being stopped.

If a predetermined time L has elapsed, when the limiter 72 determines again the difference between the amplitude of the input signal 81 and the amplitude of the signal 82. At the point of T2, the input signal 81 is constantly 5 V. On the other hand, the amplitude of the output signal 82 from the limiter 72 at the point of T2 is 1.5 V as described above. In this case, the difference in amplitude between the input signal 81 and the output signal 82 is 3.5 V, and the difference between 3.5 and the amplitude of the output signal 82 of the limiter 72 at the point of T2 is larger than 1.5 V. In this case, the limiter 72 increases the amplitude (1.5 V) of the output signal 82 at the point of T2 by 1.5 V, and outputs the result as the signal 82 having the amplitude of 3.0 V (=2 H).

The limiter 72 sequentially performs the above described process each time the time L elapses. By referring to the state shown in FIG. 8B, the output of the limiter 72 at the point of T4 is 3H=4.5 V. On the other hand, the amplitude of the control signal 81 is constantly 5 V. Therefore, the difference is 0.5 V. In this case, the limiter 72 does not limit the variance of the amplitude of the output signal 72, but changes the amplitude of the output signal 72 by the difference between the amplitude of the output signal 72 and the amplitude of the output signal input signal 71. Therefore, at the point of T4, the signal 82 having the amplitude of 5 V obtained by adding 0.5 V to the amplitude of 4.5 V of the output signal 82 at the point of T4 is output. Afterwards, the amplitude of the output signal 82 of the limiter 72 is not changed as long as the amplitude of the control signal 81 is not changed.

The limiter 72 according to an embodiment of the present invention does not limit the absolute value of the amplitude of the input signal 81, but performs a relative limiter process on the previously output value. Then, according to an embodiment of the present invention, the limiter 72 has the function of the LPF 17 having a large time constant indicated by the dotted line as shown in FIG. 4B. Since the limiter 72 comprises the DSP 71 and digitally operates, the time constant is not changed by uneven units as the LPF 17 comprising an analog circuit. Therefore, the time constant of the control signal 81 of the VCXO 18 can be set to the optimum time constant, thereby simultaneously solving the problem of the stop of the output of the VCXO 18 and the problem of the delay of the control signal 81.

To change a time constant, the values of H and L shown in FIG. 8B are appropriately changed. Either a large or small time constant can be set depending on the correlation between the amplitude variance H and the time L. The time constant is set to an appropriate value depending on the type of apparatus or the environment of the apparatus, etc. such that there occurs no problem of the stop of the output of the VCXO 18, or no problem of the delay of a control signal.

In the present embodiment, the function of the limiter 72 is realized in a digital process using the DSP 71, etc. As a result, it is not necessary to make amendments to the hardware of the conventional modem shown in FIG. 2. Since all functions of the limiter are realized by firmware, the functions of the limiter according to the present embodiment can be added to an existing modem by installing the firmware for realizing the functions of a limiter in the modem shown in FIG. 2.

A time constant can also be set simply by rewriting the firmware. Thus, the time constant of the limiter 72 of the same modem can be varied by the above described simple operation as necessary.

FIG. 8C shows the waveform of an output signal 84 of the LPF 17 to which a D/A conversion result 83 of the output signal 82 of the limiter 72 shown in FIG. 8B is input. Since the LPF 17 according to the present embodiment has a time constant, the output signal 84 indicates a gradual waveform. The waveform is compared with the waveform (indicated by a solid line) shown in FIG. 4B. When the time constants of the LPF 17 in the figures are the same as each other, the control signal 84 input to the VCXO 18 changes more gradually in the case shown in FIG. 8C by the function of the limiter 72. Therefore, the output of the LPF 17 becomes more gradual than in the case indicated by the solid line shown in FIG. 4B. That is, although the time constants of the LPF 17 are the same, the variance of the control signal 84 input to the VCXO 18 can be reduced in the case shown in FIG. 8C.

In addition, the output 84 of the LPF 17 shown in FIG. 8C indicates a lower delay level of the control signal 81 than the LPF 17 having a larger constant as indicated by the dotted line shown in FIG. 4B. Therefore, the PLL control can be performed more quickly than the example indicated by the dotted line shown in FIG. 4B.

FIG. 8D shows the waveform of a signal 85 output from the VCXO 18. The variance of the control signal 81 input to the VCXO 18 is reduced to a permissible range to allow the VCXO 18 to normally function by the operation of the limiter 72. Therefore, the output of the VCXO 18 does not stop in the example shown in FIG. 8D. As a result, the operations of each unit of the modem in and after the clock generation circuit (frequency division circuit) 19 does not abnormally function, but stable communicating operations can be realized.

Thus, the problem that the output of the VCXO 18 may stop for a moment can be solved by applying the present embodiment to a modem. Therefore, since the VCXO 18 can be applied to the PLL control, the jitters of the PLL control can be reduced, thereby performing the PLL control applicable to a high-speed modem for transmitting data at a data rate of several Mbps with high precision. The above described embodiment is an example of applying the present invention to a child station modem. However, it is obvious that the present invention can also be applied to the ST1-PLL control (external transmission timing synchronization) using a parent station modem.

Figure 9:
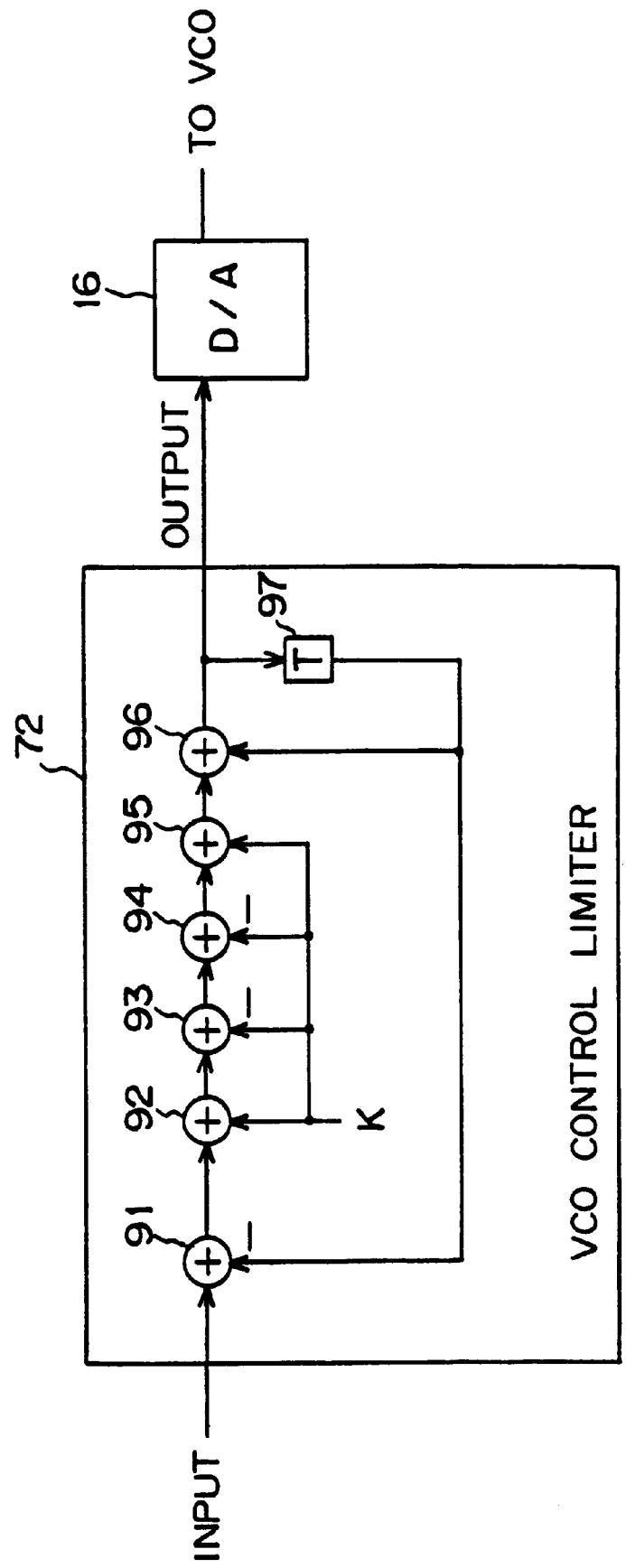
FIG. 9 shows an example of the configuration of the limiter according to an embodiment of the present invention.

FIG. 9 shows an example of the configuration of the limiter 72 according to an embodiment of the present invention. In FIG. 9, the limiter 72 is provided with adders 91 through 96 and a tap 97. The adder 91 subtracts an input signal and an output from the tap 97, the adder 92 adds an output of the adder 91 and a constant K, the adder 93 subtracts an output of the adder 92 and the constant K, the adder 94 subtracts an output of the adder 93 and the constant K, the adder 95 adds an output of the adder 94 and the constant K, the adder 96 adds an output of the adder 95 and an output of the tap 97, and the tap 97 stores an output of the adder 96.

The output of the adder 91 indicates the difference between the previous output value and the current output value. The adders 92 through 95 add the constant K twice to the difference, and subtract it twice from the difference. Therefore, the original value should be obtained as a result. However, when the limiter 72 comprises the DSP 71, the difference can be clamped in the clamping operation of the DSP 71.

The operation of the limiter 72 is described below using a numeric example (hexadecimal). In this example, K is set to 7800. The variance of the limiter in the positive direction is 07 FF, and the variance of the limiter in the negative direction is 0800. The DPS71 is 16 bits in width, and the operation is performed in the range from 7 FFF to 8000. If the range is exceeded, the value is clamped.

When an input is larger by 1000 according to the previous output, the output of the adder 91 is 1000. The output of the adder 92 is 7 FFF (since the adding result is larger than 7 FFF in this case, it is clamped to 7 FFF by the DSP 71). The output of the adder 93 is 07 FF. The output of the adder 94 is 8 FFF. The output of the adder 95 is 07 FF. As a result, when the difference in the positive direction from the previous output is larger than 07 FF, the difference can be limited to 07 FF.

When an input is smaller by 1000 according to the previous output, the output of the adder 91 is F000 (=−1000). The output of the adder 92 is 6800. The output of the adder 93 is F000. The output of the adder 94 is 8000 (since the subtracting result is smaller than 8000 in this case, it is clamped to 8000 by the DSP 71). The output of the adder 95 is F800 (=−8000). As a result, when the difference in the negative direction from the previous output is larger than 0800, the difference can be limited to 0800.

When an input is larger by 0400 according to the previous output, the output of the adder 91 is 0400. The output of the adder 92 is 7 C00. The output of the adder 93 is 0400. The output of the adder 94 is 8 C00. The output of the adder 95 is 0400. As a result, when the difference in the positive direction from the previous output is smaller than 07 FF, the difference is not limited, but is output as is.

When an input is smaller by 0400 according to the previous output, the output of the adder 91 is FC00 (=−0400). The output of the adder 92 is 7400. The output of the adder 93 is FCOO. The output of the adder 94 is 8400. The output of the adder 95 is FCOO (=−0400). As a result, when the difference in the negative direction from the previous output is smaller than 0800, the difference is not limited, but is output as is.

Thus, the constant K is added to a difference value, and the adding result is set out of the range of the value to be processed by the DSP 71, thereby clamping the adding result by the DSP 71. Then, by subtracting the constant K from the clamping result, the difference value can be clamped to a value equal to or smaller than a predetermined value.

Similarly, the constant K is subtracted from a difference value, and the subtracting result is set out of the range of the value to be processed by the DSP 71, thereby clamping the subtracting result by the DSP 71. Then, by adding the constant K to the clamping result, the difference value can be clamped to a value equal to or larger than a predetermined value.

Figure 10:
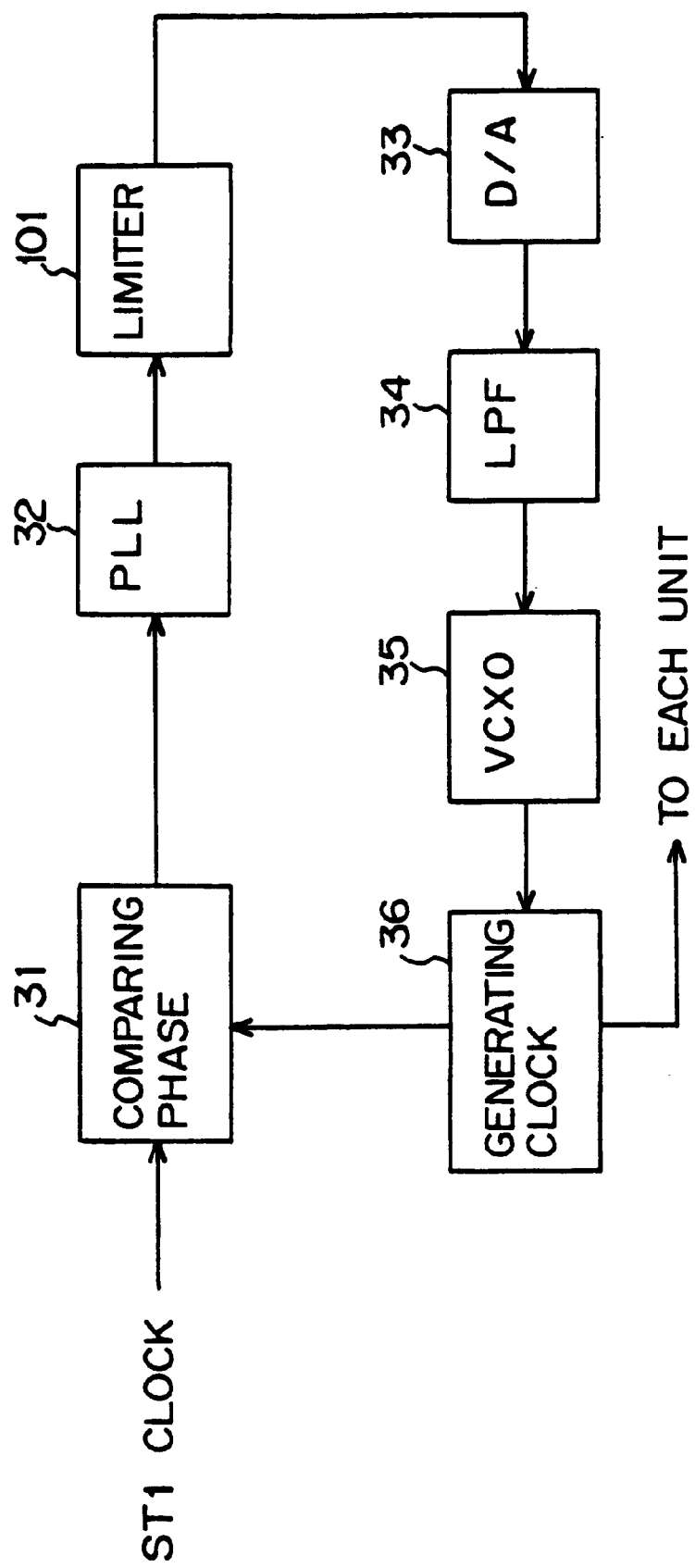
FIG. 10 is a block diagram of the configuration of the modem according to another embodiment of the present invention.

FIG. 10 is a block diagram in which a unit relating to the PLL control of a modem according to another embodiment of the present invention is extracted. Especially, it shows a parent station modem.

In the case shown in FIG. 10, a limiter 101 is provided at the stage after the PLL unit 32. The basic operations are not specifically described because the modem is similar to the modem shown in FIG. 7. However, even when a case where a timing signal ST 1 input to a parent station modem is interrupted arises, the output of the VCXO 35 can be prevented from stopping even for a moment.

The present embodiment is applied to a modem, but it is obvious that the present invention can be applied to any other devices performing the PLL control.

FIG. 11 is a block diagram of the configuration in which a PLL controller or a limiter according to an embodiment of the present invention is realized by software.

In FIG. 11, a central processing unit (CPU) 111 performs an entire process, 112 is read-only memory, 113 is random access memory (RAM), 114 is a communications interface, 115 is a communications network, 156 is an input/output interface, a display 157 displays communications data, etc., a printer 158 prints a communications result, etc., memory 119 temporarily stores data read by a scanner 160, the scanner 160 reads communications data, etc., a keyboard 121 inputs limit value data, etc., a pointing device 122 can be a mouse, etc., a driver 123 drives a storage medium, 124 is a hard disk, 125 is a IC memory card, 126 is a magnetic tape, 127 is a floppy disk, an optical disk 128 can be CD-ROM, DVD-ROM, etc., and 129 is a bus.

A program for performing PLL control, limit value data, etc. are stored in a storage medium such as the hard disk 124, the IC memory card 125, the magnetic tape 126, the floppy disk 127, the optical disk 128, etc. The PLL control can be performed by reading the program for performing the PLL control, limit value data, etc. from the storage medium to the RAM 113. In addition, the ROM 112 can also store the program for performing the PLL control.

Furthermore, a program for performing the PLL control, the limit value data, etc. can be retrieved from the communications network 115 through the communications interface 114. As the communications network 115 connected to the communications interface 114, for example, a radio communications network such as a LAN (Local Area Network), a WAN (Wide Area Network), Internet, an analog telephone network, a digital telephone network ISDN (Integral Service Digital network), a PHS (personal handy system), satellite communications, etc. can be used.

When a program for performing the PLL control is activated, the CPU 111 stores the amplitude of a control signal currently input to a voltage-controlled oscillator. Then, at predetermined time intervals, it compares the amplitude of the control signal currently input to the voltage-controlled oscillator with the amplitude of the control signal to be input, and computes the difference between them. If the difference is larger than a predetermined limit value, the limit value is added to or subtracted from the currently input control signal, and the result is output to the voltage-controlled oscillator. On the other hand, if the difference is smaller than the predetermined limit value, then a control signal to be input is output to the voltage-controlled oscillator with its amplitude unchanged.

As described above, the present invention can be used in the method of controlling a phase locked loop (PLL) in a transmission device such as a modem, etc. to prevent a momentary stop of a voltage-controlled oscillator caused by a sudden change in amplitude of a control signal input to the voltage-controlled oscillator. In addition, for example, the present invention can be applied to a device performing PLL control such as a magnetic disk device, etc.

What is claimed is:

1. A PLL controller, comprising:
    a timing extraction unit extracting a timing element from an input signal;
    a PLL unit outputting a control signal for use in controlling a phase and/or a frequency of a clock signal according to a phase and/or a frequency of the extracted timing element;
    a limiter unit receiving the control signal, limiting an amplitude of an output signal depending on an amplitude of the received control signal, and outputting the output signal; and
    a voltage-controlled oscillator unit controlling a frequency of an output signal of the voltage-controlled oscillator unit according to the output signal from said limiter unit, wherein
    when a difference between an amplitude of a current control signal received and an amplitude of a current output signal is equal to or larger than a predetermined value, said limiter unit limits the amplitude of the current output signal to the predetermined value, and outputs a resultant limited signal.

2. A PLL controller, comprising:

a phase comparison unit comparing a phase of an input timing signal with a phase of a clock signal:

a PLL unit outputting a control signal for use in controlling a phase and/or a frequency of the clock signal according to a phase comparison result by said phase comparison unit;

a limiter unit receiving the control signal, limiting an amplitude of an output signal depending on an amplitude of the received control signal, and outputting the output signal; and a voltage-controlled oscillator unit controlling a frequency of an output signal of the voltage-controlled oscillator unit according to the output signal from said limiter unit, wherein when a difference between an amplitude of a current control signal received and an amplitude of a current output signal is equal to or larger than a predetermined value, said limiter unit limits the amplitude of the current output signal to the predetermined value, and outputs a resultant limited signal.

3. A PLL controller, comprising:

a PLL unit outputting a control signal for use in controlling a phase and/or a frequency of a clock signal according to an input timing signal;

a limiter unit receiving the control signal, limiting an amplitude of an output signal depending on an amplitude of the received control signal, and outputting the output signal; and a voltage-controlled oscillator unit controlling a frequency of an output signal of the voltage-controlled oscillator unit according to the output signal from said limiter unit, wherein when a difference between an amplitude of a current control signal received and an amplitude of a current output signal is equal to or larger than a predetermined value, said limiter unit limits the amplitude of the current output signal to the predetermined value, and outputs a resultant limited signal.

4. A PLL controlling method, comprising:

outputting a control signal for use in controlling a phase and/or a frequency of a clock signal according to an input timing signal;

limiting an amplitude of the control signal; and controlling a frequency of an output signal of a voltage-controlled oscillator according to the control signal whose amplitude is limited;

generating the clock signal from the output signal of the voltage-controlled oscillator unit, wherein:

an amplitude of a current control signal and an amplitude of a current output signal are compared;

when a difference between the amplitude of the current input control signal and the amplitude of the current output signal is larger than a predetermined limit value as a result of the comparison, the current output signal is increased or decreased by the limit value, and is then output; and when the difference between the amplitude of the current input control signal and the amplitude of the current output signal is not larger than the predetermined limit value, the current output signal is increased or decreased by the difference, and is then output.

5. A method of controlling an oscillation frequency, comprising:

inputting a control signal for use in controlling an oscillation frequency of a voltage-controlled oscillator;

providing the current control for the voltage controlled oscillator without modification when variance of the current control signal is equal to or smaller than a predetermined value; and limiting an amplitude of the current control signal to the predetermined value and providing the signal to the voltage-controlled oscillator when the amplitude of the current control signal is larger than the predetermined value.

6. A limiter limiting and outputting a current output signal related to a current input signal, comprising:

comparing an amplitude of the current input signal with the amplitude of a current output signal;

outputting the current output signal after increasing or decreasing the current output signal by a predetermined limit value when a difference between the current input signal and the current output signal is larger than the limit value; and outputting the current output signal after increasing or decreasing the current output signal by the difference when the difference is not larger than the limit value.

7. The limiter according to claim 6, wherein;

said limiter compares the amplitude of the current input signal with the amplitude of the current output signal at predetermined time intervals.

8. A computer-readable storage medium storing a program used to direct a computer, comprising:

comparing amplitude of a current input signal with amplitude of a current output signal;

outputting the output signal after increasing or decreasing the output signal by a predetermined limit value when a difference between the current input signal and the current output signal is larger than the limit value; and outputting the current input signal as is when the difference between the current input signal and the current output signal is not larger than the limit value.

* * * * *